(12) United States Patent
Mui

(10) Patent No.: US 7,271,675 B2
(45) Date of Patent: Sep. 18, 2007

(54) AUTOMATIC GAIN CONTROL CIRCUIT AND METHOD AND SUPER-REGENERATIVE RF RECEIVER

(75) Inventor: Ka Chung Vincent Mui, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 131 days.

(21) Appl. No.: 11/160,286

(22) Filed: Jun. 17, 2005

(65) Prior Publication Data
US 2006/0284696 A1 Dec. 21, 2006

(51) Int. Cl.
*H03B 5/00* (2006.01)
(52) U.S. Cl. ............... 331/183; 331/182; 331/175; 331/74
(58) Field of Classification Search ........... 331/182, 331/175, 74, 183
See application file for complete search history.

(56) References Cited

U.S. PATENT DOCUMENTS 6,864,756 B2   3/2005   Peng ................ 331/173

2003/0025566 A1 *   2/2003   Rogers .............. 331/109
2004/0212444 A1   10/2004   Peng .................. 331/175

OTHER PUBLICATIONS

Article titled "A Low-Power CMOS Super-Regenerative Receiver at 1 GHz" published by Alexandre Vouilloz on Mar. 2001 (12 pages).

* cited by examiner

*Primary Examiner*—Arnold Kinkead
(74) *Attorney, Agent, or Firm*—Jianq Chyun IP Office

(57) ABSTRACT

An automatic gain control (AGC) circuit is applied to control a margin voltage of an oscillator. The margin voltage is the voltage difference between a high-level output and a low-level output of the oscillator. The AGC circuit of the present invention includes a comparator and a processing unit. Wherein, the comparator compares the margin voltage of the oscillator and a reference voltage. Based on the output of the comparator, the processing unit outputs a ripple code to determine the value of a driving current output from a current generator. The oscillator generates an oscillation output to the comparator based on the driving current.

15 Claims, 6 Drawing Sheets

AUTOMATIC GAIN CONTROL CIRCUIT AND METHOD AND SUPER-REGENERATIVE RF RECEIVER

BACKGROUND OF THE INVENTION

1. Field of the Invention

The present invention relates to an automatic gain control (AGC) circuit and method, and more particularly to an automatic gain control circuit and method capable of controlling a margin voltage.

2. Description of the Related Art

In the wireless communication field, an on-off keying radio-frequency (RF) receiver of a super-regenerative architecture has better sensitivity and better noise prevention efficiency/cost ratio. Thus, it has been widely applied in apparatuses such as remote-control toy cars or other remote-control electrical devices. In the circuit structure, an automatic gain control circuit is required to control the start-up time of an oscillator to maintain the best performance.

FIG. 1 is a drawing showing signal modulations of an on-off keying RF receiver. Referring to FIG. 1, when the input data Din is 1, the output signal Sout is a carrier-modulated high-level signal. If the input data Din is 0, the level of the output signal Sout is also 0.

FIG. 2 is a circuit block diagram showing a super-regenerative RF receiver. FIG. 3 is a schematic drawing showing signal relationships of a super-regenerative RF receiver. Referring to FIGS. 2 and 3, the saw-wave generator 220 generates the saw-wave output current Iq based on the quench control signal qnch. The oscillator 210 receives the saw-wave output current Iq and the RF signal Srf to generate the oscillation output Sosc. When the received RF modulated signal Srf is high, it provides higher voltage to trigger the oscillator 210, so that the oscillator 210 generates an earlier start-up time and larger output envelope of the oscillator Sosc, as shown in FIG. 3. Similarly, when the received RF modulated signal Srf is low, the oscillator 210 provides a relative late start-up time and smaller output envelope of the oscillator Sosc. Accordingly, the received data can be regenerated and reverted by the post-level circuit.

In order to stabilize the oscillation output Sosc of the oscillator 210, the super-regenerative RF receiver comprises an automatic gain control circuit 230 as shown in FIG. 2. By controlling the value of the saw-wave output current Iq output from the saw-wave generator 220, the start-up time of the oscillation output of the oscillator 210 is adjusted.

A conventional automatic gain control circuit is disclosed in "A low-power CMOS super-regenerative receiver at 1 GHz", p. 440, vol. 36, IEEE JSSC. In the conventional circuit, the functionality of a gm-C low pass filter is to detect an energy level of the oscillation envelope. Nevertheless, the gm-C low pass filter requires a lot of large size gm-C cell to realize resistors and inductors, so it needs a lot of layout size. Also, the response time of the conventional automatic gain control circuit is slow because it needs some several bits of a data frame to obtain the signal level of the input. Since it is always in the state of tracing the operational status of signals, a great number of noises are thus generated.

In order to overcome the issue described above, the U.S. Pat. No. 6,864,756 discloses an automatic gain control circuit to stabilize a start-up time of an oscillator. In the U.S. Pat. No. 6,864,756, the automatic gain control circuit directly processes the output of the oscillator but the issue that the output of the oscillator has many noises is left unanswered. In addition, the automatic gain control circuit of the 6,864,756 patent needs to receive an external RF signal Srf, while automatic-gain controlling the oscillator. That also enhances the chance of noise interference.

SUMMARY OF THE INVENTION

Accordingly, the present invention is directed to an automatic control circuit and method, in which the margin voltage of the oscillator is adjusted to stabilize the start-up time of the oscillator.

The present invention is also directed to a super-regenerative radio-frequency (RF) signal receiver to stabilize the start-up time of the oscillator.

The present invention provides an automatic gain control circuit, capable of controlling a margin voltage of an oscillator. The margin voltage is a voltage difference between a high-level output and a low-level output of the oscillator. The automatic gain control circuit comprises a comparator and a processing unit. Wherein, the comparator compares the margin voltage of the oscillator and a reference voltage. The processing unit generates a plurality of ripple codes to determine a value of a driving current output from a current generator, based on an output of the comparator. Wherein, the oscillator generates an oscillation output to the comparator based on the driving current.

In addition, the present invention provides a super-regenerative RF signal receiver, which comprises a current generator and an oscillator. Wherein, the current generator generates a driving current so that the oscillator generates an oscillation output. In addition, the super-regenerative RF signal receiver further comprises a margin voltage generator and an automatic gain control circuit. The margin voltage generator obtains a margin voltage value based on an output of the oscillator. The margin voltage is a voltage difference between a high-level output and a low-level output of the oscillator. The automatic gain control circuit compares the margin voltage and the reference voltage. Based on a comparison result, the automatic gain control circuit generates a plurality of ripple codes for the current generator to control a value of the driving current.

In an embodiment of the present invention, the current generator comprises a saw-wave generating circuit and a gain current generating circuit. Wherein, the saw-wave generating circuit generates a saw-wave current signal. The gain current generating circuit generates a gain current signal. In addition, the gain current generating circuit determines a value of the gain current signal based on the ripple codes generated by the automatic gain control circuit. In the present invention, the saw-wave current signal plus the gain current signal are equal to the driving current.

In addition, the margin voltage generator described above comprises a rectifier circuit and a switch capacitance filter circuit. Wherein, the rectifier circuit transforms the output of the oscillator into a voltage-type square signal. The switch capacitance filter circuit receives an output of the rectifier circuit to generate the margin voltage.

In another aspect, the present invention provides an automatic gain control method. The method is also adapted to controlling a margin voltage of an oscillator. First, a plurality of ripple codes and a driving current are generated so that the oscillator generates an oscillation signal. The margin voltage is obtained based on the oscillation signal. Then, the margin voltage and a reference voltage are compared to generate a comparison result. A optimal ripple code is generated to adjust a value of the driving current according the comparison result.

In an embodiment of the present invention, if the gain current signal is set as a maximum, and margin voltage is still not larger than the reference voltage, then the gain current signal is set at the maximum.

Accordingly, the margin voltage and a reference voltage are compared in the present invention. Based on the comparison result, the ripple codes are generated to adjust the value of the driving current. Thus, the margin voltage of the oscillator of the present invention can be stabilized, and the start-up time of the oscillator can be stabilized as well.

The above and other features of the present invention will be better understood from the following detailed description of the preferred embodiments of the invention that is provided in communication with the accompanying drawings.

DESCRIPTION OF SOME EMBODIMENTS

Figure 1:
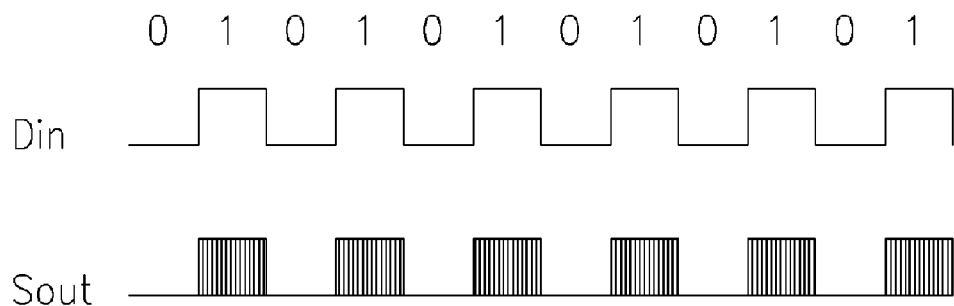
FIG. 1 is a drawing showing signal modulations of an on-off keying RF receiver.
Figure 2:
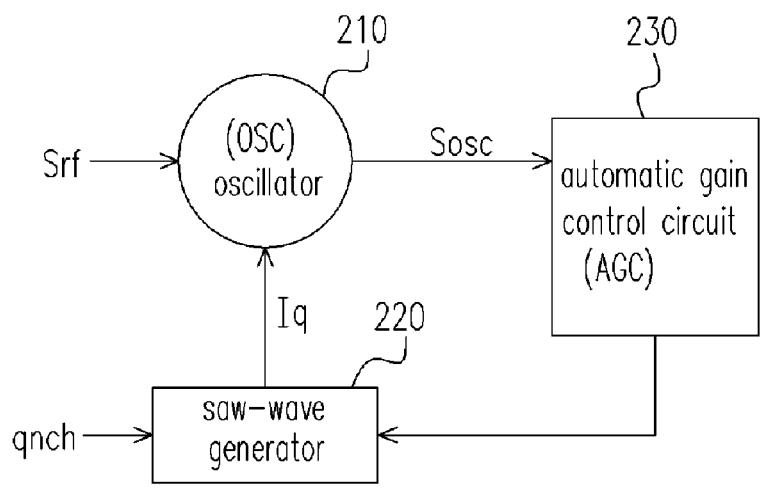
FIG. 2 is a circuit block diagram showing a super-regenerative RF receiver.
Figure 3:
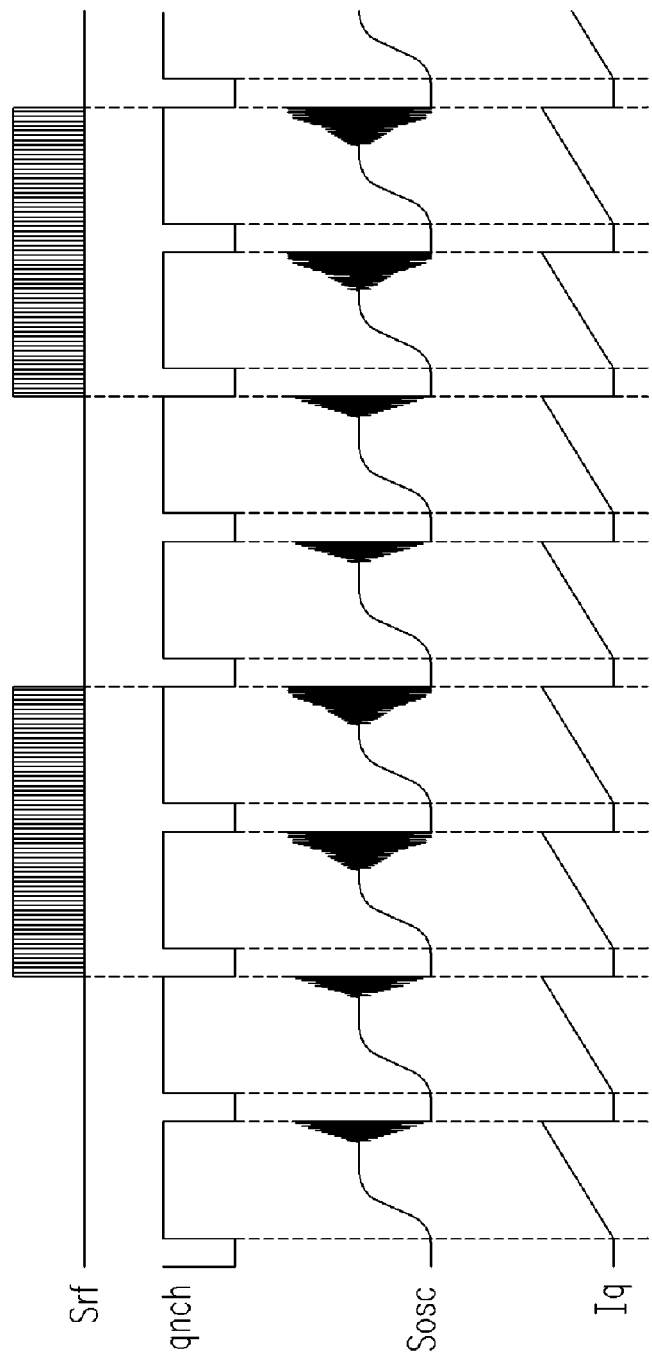
FIG. 3 is a schematic drawing showing signal relationships of a super-regenerative RF receiver.
Figure 4:
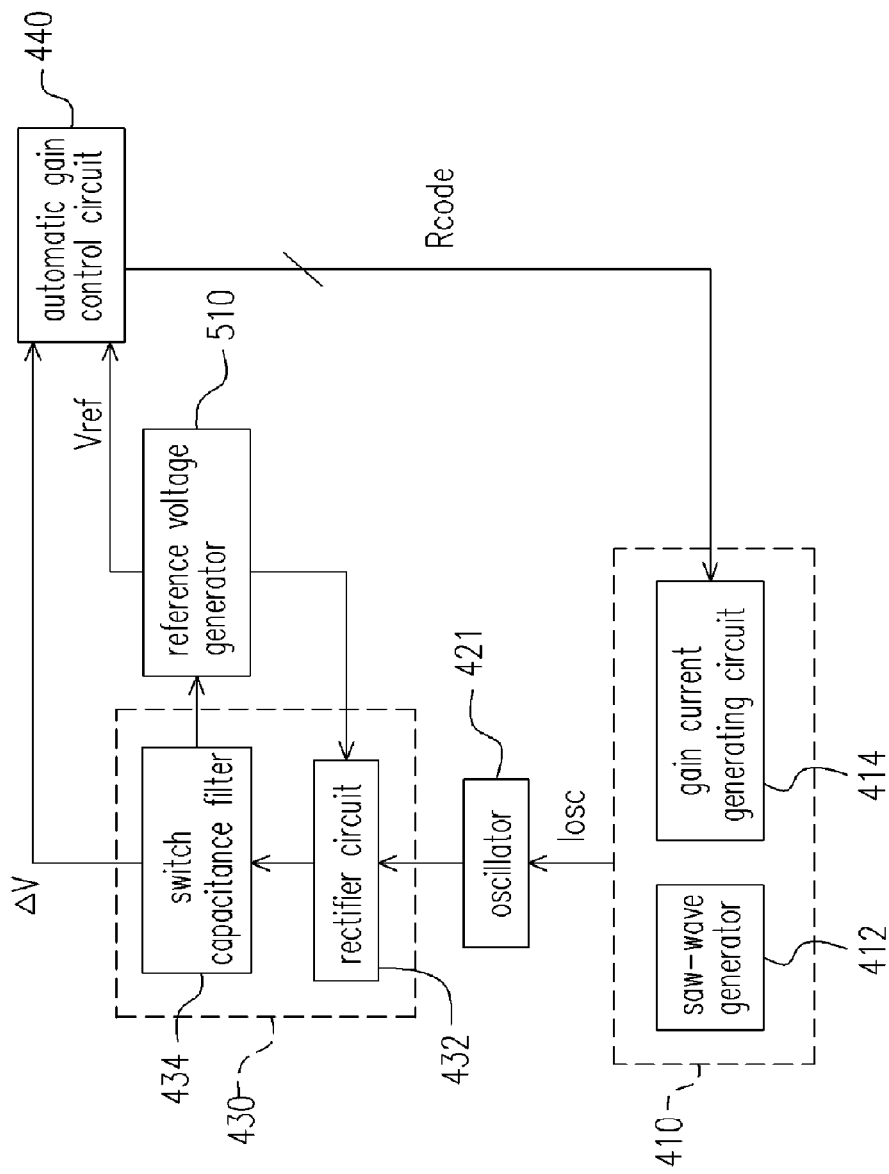
FIG. 4 is a circuit block diagram showing a super-regenerative radio-frequency (RF) signal receiver according to an embodiment of the present invention.

FIG. 4 is a circuit block diagram showing a super-regenerative radio-frequency (RF) signal receiver according to an embodiment of the present invention. Referring to FIG. 4, the current generator 410 generates the driving current Iosc for the oscillator 421 so that the oscillator 421 generates an oscillation output. The margin voltage generator 430 receives the oscillation output of the oscillator 421, and transmits the margin voltage ΔV of the oscillation output to the automatic gain control circuit 440. Wherein, the margin voltage ΔV is the voltage difference between the high-level output and the low-level output of the oscillator 421. After receiving the margin voltage ΔV output from the margin voltage generator 430, the automatic gain control circuit 440 compares the margin voltage ΔV with a reference voltage Vref. Based on the comparison result, a ripple code Rcode is generated to the current generator 410 to adjust the value of the driving current Iosc.

The current generator 410 comprises a saw-wave generating circuit 412 and a gain current generating circuit 414. Wherein, the saw-wave generating circuit 412 generates a saw-wave current signal. The gain current generating circuit 414 generates a gain current signal. In the present invention, the driving current Iosc is given by:

Iosc=Isaw+Ioagc

Wherein, Isaw represents the saw-wave current signal, and Ioagc represents the gain current signal. In the present invention, the gain current generating circuit 414 adjusts the value of the gain current signal Ioagc based on the ripple code Rcode generated from the automatic gain control circuit 440. That is, the saw-wave current signal Isaw generated from the saw-wave generating circuit 412 is substantially constant. By adjusting the gain current signal Ioagc, the value of the driving current Iosc can be determined.

In the present invention, the oscillator 421 can be a current control oscillator, for example. Accordingly, the oscillation output is in a current form. After the oscillator 421 generates the oscillation output, the oscillation output is transmitted to the rectifier circuit 432 in the margin voltage generator 430 to transform the current-form oscillation output into a voltage-form square signal. The rectifier circuit 432 then transmits the voltage-form oscillation output to the switch capacitor filter 434 for low-pass filtering, and outputs the margin voltage ΔV to the automatic gain control circuit 440.

Figure 5:
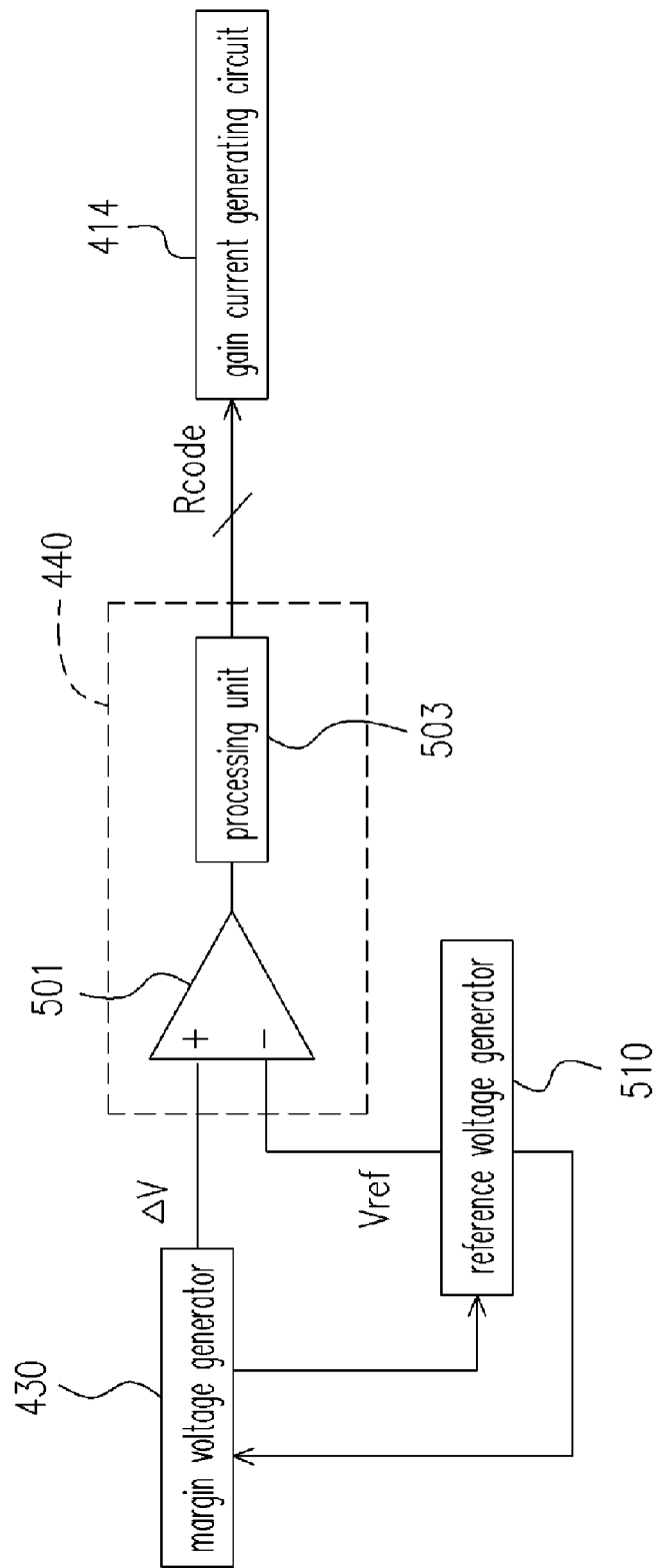
FIG. 5 is an internal circuit block diagram showing an automatic gain control circuit according to an embodiment of the present invention.

FIG. 5 is an internal circuit block diagram showing an automatic gain control circuit according to an embodiment of the present invention. Referring to FIG. 5, the automatic gain control circuit 440 comprises a comparator 501 and a processing unit 503. Wherein, a terminal of the comparator 501 is coupled to the margin voltage generator 430 to receive the margin voltage ΔV. Another terminal of the comparator 501, receives the reference voltage Vref. In this embodiment, the reference voltage Vref can be generated from the reference voltage generator 510. Wherein, after being rectified and filtered by the margin voltage generator 430, the output of the reference voltage generator 510 is then transmitted to the comparator 501. In addition, the processing unit 503 generates the ripple code Rcode to the gain current generating circuit 414 based on the output of the comparator 501.

Figure 6:
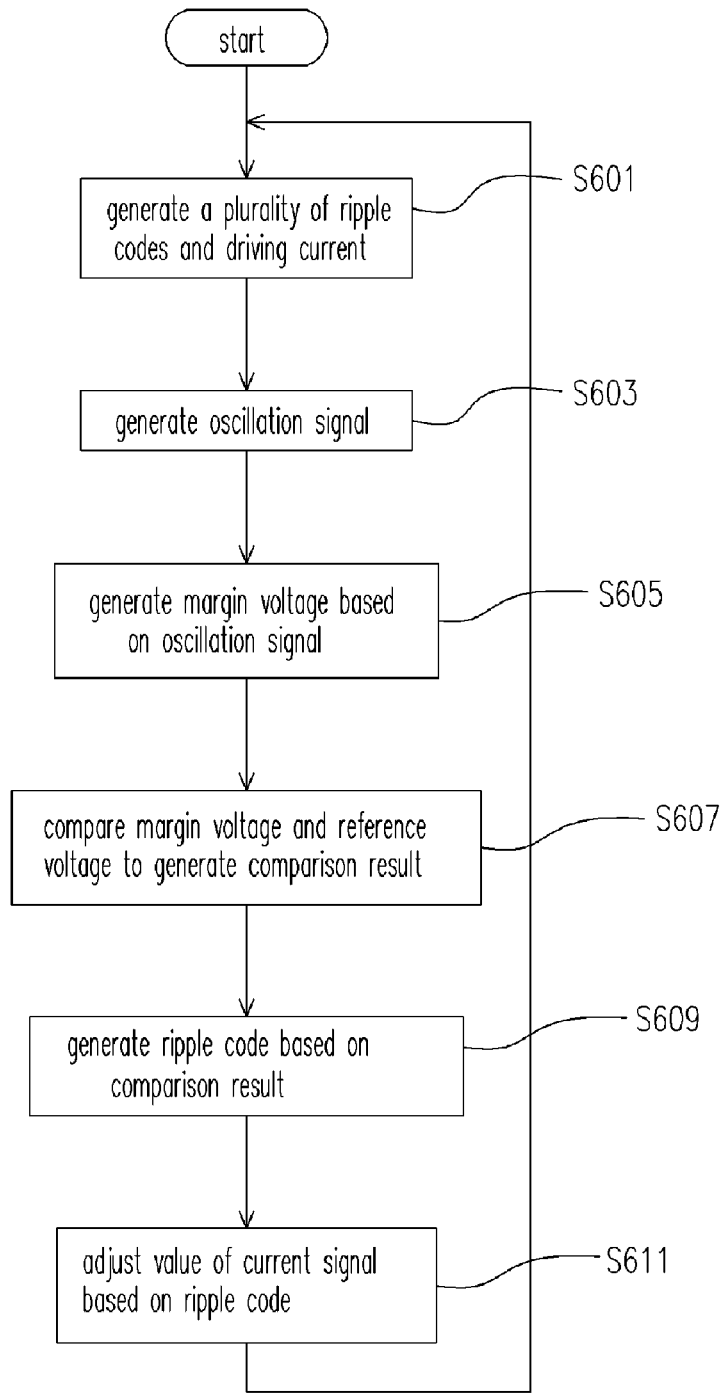
FIG. 6 is a flow chart showing an automatic gain control method according to an embodiment of the present invention.

FIG. 6 is a flow chart showing an automatic gain control method according to an embodiment of the present invention. Referring to FIGS. 4 and 6, in the step S601, the processing unit 503 generates a series of ripple codes, and the current generator 410 generates the driving current Iosc to the oscillator 421. In the step S603, the oscillator 421 generates the oscillation signal to the margin voltage generator 430. After the processing of the rectifier circuit 432 and the switch capacitance filter 434, the margin voltage generator 430 outputs the margin voltage ΔV to the comparator 501 in the step S605. In the step S607, the comparator 501 compares the margin voltage ΔV and the reference voltage Vref, and outputs the comparison result to the processing unit 503. In the step S609, the processing unit 503 generates the ripple code Rcode to the gain current generating circuit 414 based on the comparison result. In the step S611, the gain current generating circuit 414 adjusts the value of the gain current signal based on the ripple code Rcode.

Figure 7:
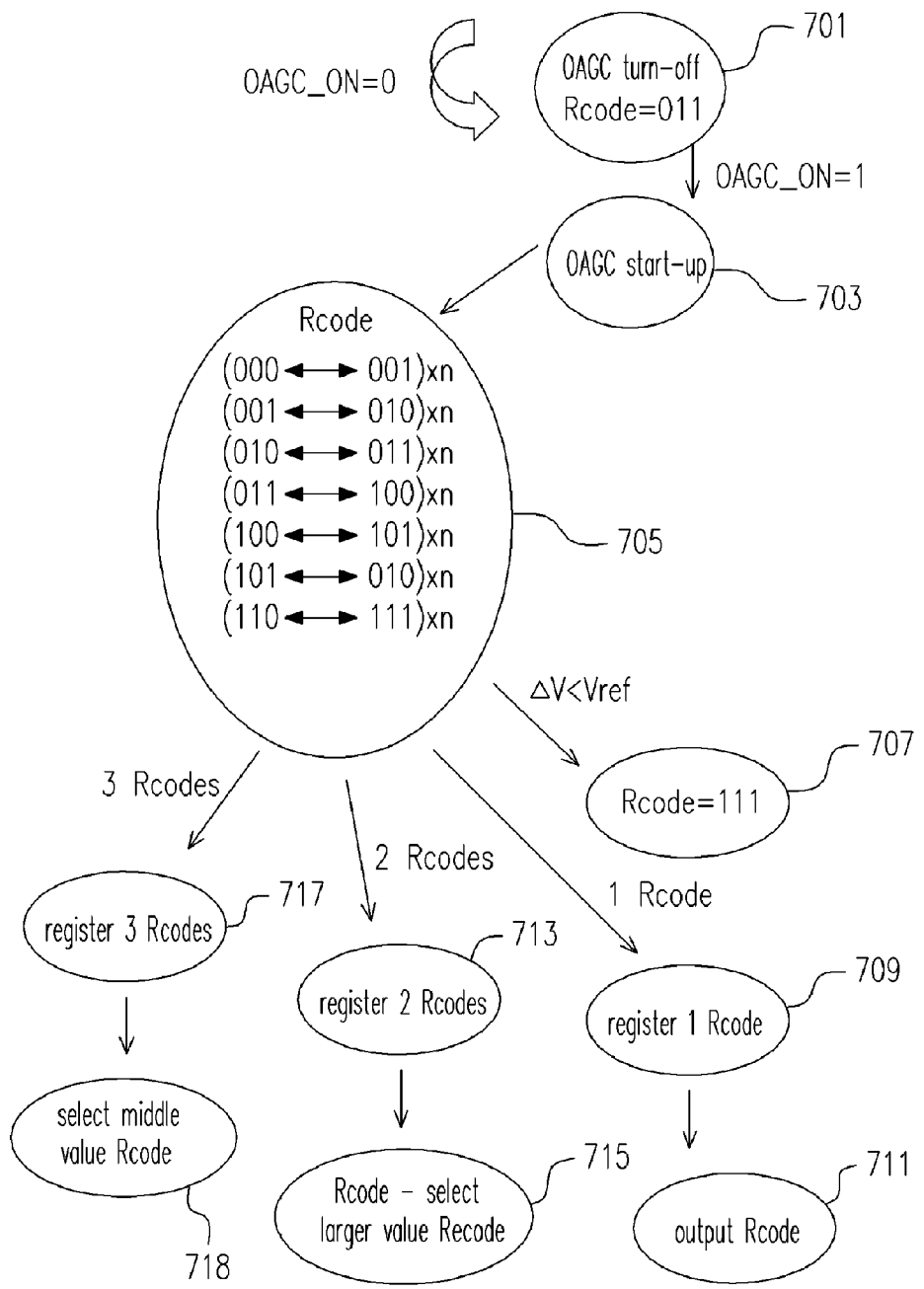
FIG. 7 is a drawing showing the states of the processing unit 503 in FIG. 5.

FIG. 7 is a drawing showing the states of the processing unit 503 in FIG. 5. Referring to FIG. 7, the automatic gain control circuit can be turned off when not in use in the present invention. The state 701 (OAGC_ON=0) indicates that the automatic gain control circuit (OAGC) of the present invention is off. Meanwhile, in the present invention, a series of reference ripple codes are output to generate the reference driving current. In this embodiment, the reference codes are represented by 011.

In the present invention, each ripple code Rcode corresponds to a gain current signal value. Detailed descriptions are mentioned above. When turned on at the state OAGC_ON=1, the automatic gain control circuit of the present invention enters the state 703. In the state 705, a series of ripple codes Rcode are output to test if the margin voltage of the oscillator is larger than reference voltage in the present invention. In this embodiment, the ripple codes vary within the range from 000 to 111. Furthermore, the value of the gain current signal is proportional to the value of the ripple code in this embodiment.

Under a condition that the maximum output ripple code, i.e., 111 in this embodiment, cannot make the margin voltage of the oscillator larger than the reference voltage ($\Delta V < Vref$), or the maximum value of the gain current signal cannot make the margin voltage larger than the reference voltage, the automatic gain control circuit of the present invention enters the state 707. That is, the ripple code Rcode is set as the maximum 111. In other words, the gain current signal is substantially set at the maximum value.

If a gain current signal corresponding to one of the ripple codes Rcode makes the margin voltage of the oscillator larger than the reference voltage (1 Rcode), the ripple code is registered as shown in the state 709 of the present invention. In the state 711, the ripple code is then output.

When gain current signals corresponding to two of the ripple codes Rcode make the margin voltage of the oscillator larger than the reference voltage (2Rcodes), the automatic gain control circuit of the present invention enters the state 713, where these ripple codes are registered. In the state 715, the automatic gain control circuit of the present invention outputs the larger one of the two ripple codes.

When gain current signals corresponding to three of the ripple codes Rcode make the margin voltage of the oscillator larger than the reference voltage (3Rcodes), the automatic gain control circuit of the present invention enters the state 717, where these ripple codes are registered. In the state 718, the automatic gain control circuit of the present invention outputs the middle value of the three ripple codes.

Since the system size and manufacturing cost depend on the amount of the registers, in the present invention, only three registered ripple codes are provided. If a fourth ripple code makes the margin of the oscillator larger than the reference voltage, the function of register shift is applied. One of ordinary skill in the art will know that FIG. 7 is only an embodiment of the present invention. In a real situation, a designer may add the number of the registers based on actual requirement without departing from the scope of the present invention. Additionally, the number of the ripple codes can be adjusted based on actual requirements.

Moreover, in some embodiments, the automatic gain control circuit 440 in FIGS. 4 and 5 can be performed by a software.

Accordingly, the present invention includes at least the following advantages.

In the present invention, the ripple code is generated to adjust the value of the gain current signal based on whether the margin voltage is larger than the reference voltage. Thus, the oscillator of the present invention has a more stable oscillation start-up time. In the present invention, the automatic gain control circuit can be performed by a software and thus has faster response.

In the present invention, the output of the switch capacitance filter is processed. Noise interference can be reduced.

During operation of the present invention, an external input signal is not required. Noise interference can also be reduced.

Functions of analog circuits and digital-logic circuits are combined in the present invention.

The automatic gain control circuit of the present invention is turned off when not in use. The processing of the post-level circuit is not affected.

In the present invention, the automatic gain control circuit has faster response without additional external input signals, and is thus adapted to high-frequency and multi-channel applications.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. An automatic gain control circuit, adapted for controlling a margin voltage of an oscillator, the automatic gain control circuit comprising:
   a comparator comparing a margin voltage of the oscillator and a reference voltage, wherein the margin voltage is a voltage difference between a high-level output and a low-level output of the oscillator; and
   a processing unit coupled to the comparator, based on an output of the comparator, generating a plurality of ripple codes to determine a value of a driving current output from a current generator, thereby the oscillator generating an oscillation output to the comparator based on the driving current.

2. The automatic gain control circuit of claim 1, wherein the current generator comprises:
   a saw-wave generating circuit, generating a saw-wave current signal; and
   a gain current generating circuit, generating a gain current signal, and determining a value of the gain current signal based on the ripple codes, wherein the saw-wave current signal plus the gain current signal are equal to the driving current.

3. The automatic gain control circuit of claim 1, wherein the automatic gain control circuit is performed by a software.

4. A super-regenerative radio-frequency (RF) receiver, comprising:
   a current generator, generating a driving current;
   an oscillator coupled to the current generator, based on the driving current, generating an oscillation output;
   a margin voltage generator coupled to the oscillator, generating a margin voltage based on an output of the oscillator, wherein the margin voltage is a voltage difference between a high-level output and a low-level output of the oscillator; and
   an automatic gain control circuit coupled to the margin voltage generator and a reference voltage, comparing the margin voltage and the reference voltage, based on a comparison result, generating a plurality of ripple codes to the current generator to control a value of the driving current.

5. The super-regenerative RF receiver of claim 4, wherein the automatic gain control circuit comprises:
   a comparator, receiving and comparing the margin voltage of the oscillator and the reference voltage; and
   a processing unit coupled to the comparator, based on an output of the comparator, generating the ripple codes to the current generator to determine the value of the driving current.

6. The super-regenerative RF receiver of claim 5, wherein the automatic gain control circuit is performed by a software.

7. The super-regenerative RF receiver of claim 4, wherein the current generator comprises:

a saw-wave generating circuit, generating a saw-wave current signal; and a gain current generating circuit, generating a gain current signal, determining a value of the gain current signal based on the ripple codes, wherein the saw-wave current signal plus the gain current signal are equal to the driving current.

8. The super-regenerative RF receiver of claim 4, wherein the margin voltage generator comprises:

a rectifier circuit, transforming the output of the oscillator into a voltage-type square signal; and a switch capacitance filter circuit, receiving an output of the rectifier circuit to generate the margin voltage.

9. The super-regenerative RF receiver of claim 4, wherein the reference voltage is generated from a reference voltage generator.

10. An automatic gain control method, adapted for controlling a margin voltage of an oscillator, the automatic gain control method comprising:

generating a plurality of ripple codes and a driving current so that the oscillator generates an oscillation signal;

obtaining a margin voltage based on the oscillation signal, wherein the margin voltage is a voltage difference between a high-level output and a low-level output of the oscillator;

comparing the margin voltage and a reference voltage to generate a comparison result; and generating a optimal ripple code to adjust a value of the driving current according the comparison result.

11. The automatic gain control method of claim 10, wherein the step of generating the margin voltage further comprises:

transforming the oscillation signal into a voltage-form oscillation signal; and low-pass filtering the voltage-form oscillation signal to obtain the margin voltage.

12. The automatic gain control method of claim 10, wherein the driving current comprises a saw-wave current signal and a gain current signal.

13. The automatic gain control method of claim 10, wherein the saw-wave current signal is substantially constant.

14. The automatic gain control method of claim 10, wherein a value of the gain current signal is determined by the ripple codes.

15. The automatic gain control method of claim 10, wherein if the gain current signal is set as a maximum, and margin voltage is still not larger than the reference voltage, the gain current signal is set at the maximum.

* * * * *